United States Patent [19]

Heck

[11] Patent Number: 5,079,526
[45] Date of Patent: Jan. 7, 1992

[54] FREQUENCY MODULATED SYNTHESIZER USING LOW FREQUENCY OFFSET MIXED VCO

[75] Inventor: Joseph P. Heck, Ft. Worth, Tex.

[73] Assignee: Motorola, Inc., Schaumburg, Ill.

[21] Appl. No.: 574,626

[22] Filed: Aug. 29, 1990

[51] Int. Cl.[5] .................. H03C 3/00; H03D 3/00; H03L 7/06

[52] U.S. Cl. .................. 332/127; 329/325; 331/2; 331/23; 375/59; 375/81

[58] Field of Search .................. 332/127; 329/325; 331/2, 23; 375/81, 59, 120; 455/110, 112, 208, 209, 216, 260, 337

[56] References Cited

U.S. PATENT DOCUMENTS

| | | | |
|---|---|---|---|
| 4,610,030 | 9/1986 | Dominguez et al. | 331/23 X |
| 4,837,853 | 6/1989 | Heck | 329/325 X |
| 4,882,549 | 11/1989 | Galani et al. | 331/14 |
| 4,912,432 | 3/1990 | Galani et al. | 331/2 |

Primary Examiner—David Mis
Attorney, Agent, or Firm—Daniel K. Nichols

[57] ABSTRACT

An improved frequency synthesizer 100 capable of producing true DC frequency modulation without the need to DC frequency modulate the reference oscillator. The synthesizer 100 includes a phase comparator 104 compares the reference signal 102 and the feedback signal 112. The output of said phase comparator 104 filtered and coupled to the main VCO 108. A balanced image mixer 200 mixes the two signals from the main VCO 108 and an offset VCO 300. The offset VCO 300 is a low frequency (e.g. 100 to 300 KHz) integrated offset VCO 308 whose center frequency is controlled accurately, by means of matching to a VCO 306 which is controlled by a feedback loop, and by using an image balanced mixer 200 to reduce the image response to substantially reduce or eliminate the filtering required at the mixer output. The configuration of the offset mixer within the synthesizer loop, any residual spurious content due to imperfect image balance or carrier feedthrough of the mixer is attenuated by the loop response. The output signal of the mixer 200 is looped back to the phase comparator 104 after being divided by N through a divider 114.

12 Claims, 4 Drawing Sheets

5,079,526

FREQUENCY MODULATED SYNTHESIZER USING LOW FREQUENCY OFFSET MIXED VCO

TECHNICAL FIELD

This invention relates generally to frequency synthesizers and more specifically to frequency synthesizers capable of producing true DC FM and is particularly directed toward frequency synthesizers capable of producing DC FM without requiring DC FM of the reference oscillator.

BACKGROUND

Present two-way FM radio communication systems, with closely spaced channels, place stringent requirements on their internal frequency determining elements. Some of which are stability, low frequency modulation response, and cost. To meet these requirements most receivers use a local oscillator to convert the incoming signal to a frequency at which it is easier to obtain selectivity and gain than at the carrier frequency. In the superhetrodyne method, the local oscillator frequency differs from that of the incoming signal by an amount equal to an intermediate frequency (IF); in the direct conversion method, the oscillator frequency equals the carrier frequency, which places the IF at baseband or zero frequency.

Closely spaced channels require receivers to have narrow band pass IF filters to reject adjacent channel interference and to obtain good sensitivity. Frequency tolerances in both the local oscillator and the received signal can allow the generated IF signal to fall outside the passband of the narrow filter. At UHF frequencies of 800 MHz and above, an error of only 2 parts-per-million (ppm) in the transmitted frequency could cause ±1.6 kHz error. The local oscillator could have similar tolerance and result in several kilohertz net frequency error at the IF. With the filter bandwidth required for 12.5 kHz channel spacing, errors of several kilohertz make it impractical to center the received signal in the IF filter passband without using additional frequency control means.

In tracking variations of the carrier frequency, local oscillator control loops interfere with demodulation of low-frequency FM information, which resides in instantaneous variations of the carrier frequency. Demodulation circuits expect these variations to be present after the carrier is translated to IF, but the control loops remove modulation components having frequencies within their loop bandwidths. The severity of this problem depends on the frequency content of the modulation signals and on the bandwidth of the control loop.

Typically, FM radio communication systems avoid modulation at DC, which requires shifts in the carrier frequency that are indistinguishable from static frequency errors. However, some signals, such as digital signalling data, may have frequency components at 10 Hertz or less. The transmission and reception of such data requires circuits capable of processing low frequency and even DC FM signals. With such wide spread use of data communications in today's systems, it is impractical for advanced communication systems to be incompatible with data transmission and reception.

In the design of synthesizers a means to achieve DC FM is by modulating the reference oscillator. Modulating the reference oscillator is costly and not desirable otherwise. Since the reference oscillator of the synthesizer is used by other circuits in the design such as filters, controllers, and micro-processors any modulation of the reference oscillator will have direct effect on the performance of mentioned circuits.

Alternatively, the conventional offset approach in the design of synthesizers requires a fairly high frequency offset VCO so that the undesired image response of the mixer output can be filtered effectively. This adds to the cost of the RF bandpass filter. Furthermore, it is impossible to achieve good center frequency accuracy of the offset oscillator without using a crystal, which would again add to the circuit cost.

Thus, a need clearly exists for an approach to produce DC FM without the high cost of any additional crystals or the requirement to DC frequency modulate the reference oscillator.

SUMMARY OF THE INVENTION

Briefly, according to the invention, an improved frequency synthesizer that is capable of producing true DC FM is being disclosed. The synthesizer comprises of a phase comparator having its first input connected to a reference signal source. The output of the phase comparator which is a control signal representing the phase differential of its two inputs is connected to a signal controlled oscillator. The output signal of the signal controlled oscillator has a frequency f corresponding to the control signal applied to its input.

The output of the signal controlled oscillator is connected to the first input of an offset mixer. The second input to this mixer is $f_{OFF}$ the output signal of an offset signal controlled oscillator which is responsive to an input modulating signal. The output signal of the offset mixer is connected to a divide by N divider whose output is connected to the second input of the phase comparator.

DETAILED DESCRIPTION OF THE PREFERRED EMBODIMENT

Figure 1:
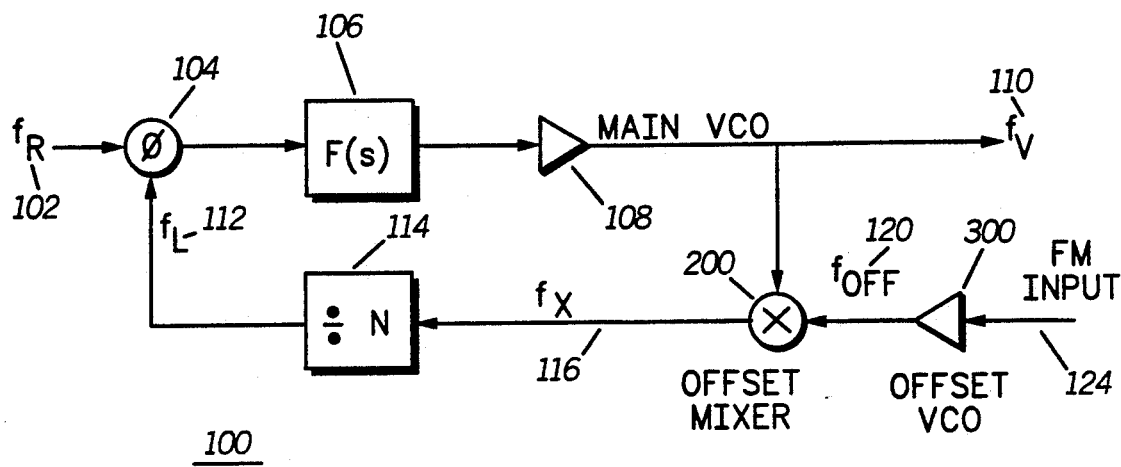
FIG. 1 is a block diagram of a synthesizer using the offset mixing loop approach in accordance with the present invention.

Referring to FIG. 1, a frequency synthesizer 100 includes a phase comparator 104, a filter 106, and a signal controlled oscillator 108 (main VCO 108) using voltage as its control signal. The frequency synthesizer 100 further includes an offset signal controlled oscillator (offset VCO) 300, using voltage as its control signal, a mixer 200, and a divide by N divider 114.

A reference signal $f_R$ 102 is applied to the first input of phase comparator 104. The second input of the phase comparator 104 is $f_L$ 112 which is the output of the divide-by-N divider 114. The output signal of phase detector 104 is filtered by the loop filter 106 and is coupled to the voltage controlled oscillator (VCO) 108. The output of VCO 108 is connected to the first input of the offset mixer 200 whose second input is the offset frequency signal 120 ($f_{OFF}$) of the offset VCO.

The properties and operation of phase locked loops is well known to those skilled in the art. The reader is referred to the standard text, such as Gardner, F. M., phaselock Techniques, New York: Wiley 2nd edition 1979, for greater detail. When the loop is locked the following condition prevails:

$$f_L = f_R$$

since $f_X = Nf_L$ then $f_X = Nf_R$. Since the output of offset mixer 200 is $$f_X = f_V - f_{OFF} = Nf_R$$

It is concluded that the synthesizer output frequency 110 is $$f_V = Nf_R + f_{OFF}$$

The above conclusion indicates the dependence of the output signal $f_V$ 110 on the reference signal $f_R$ 102 and the offset frequency signal $f_{OFF}$ 120. The reference frequency signal $f_R$ 102 is a highly stable oscillator signal used in the entire transceiver circuit. The offset frequency $f_{OFF}$ 120 is a low frequency (100 to 300 KHz) signal. Consequently, it is not necessary for $f_{OFF}$ 120 to have the same tight tolerances as is required by the frequency oscillators of the conventional VCO circuits resulting in considerable cost differentials.

Figure 2:
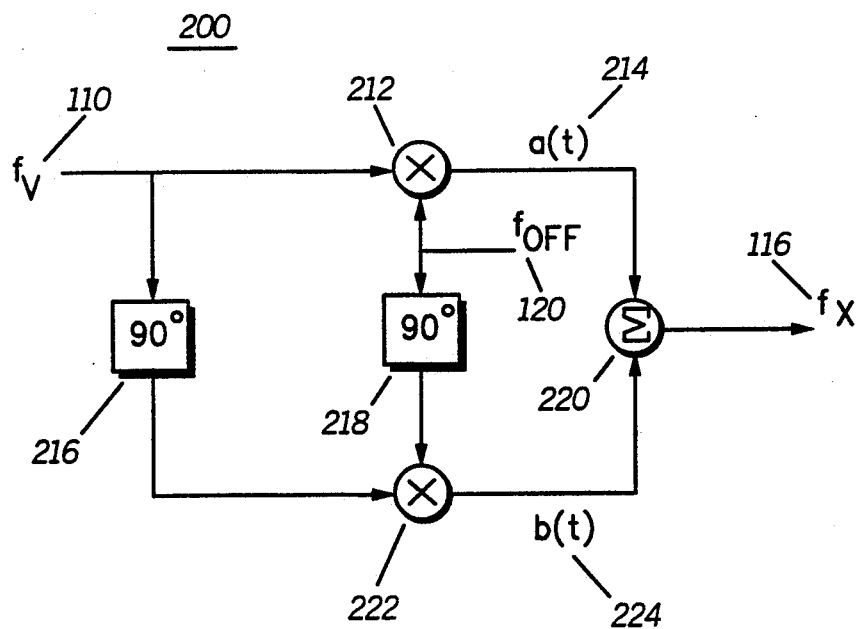
FIG. 2 is a block diagram of an image balanced mixer used in the frequency synthesizer of FIG. 1.

The offset mixer 200 used in the synthesizer 100 is of image balanced type. FIG. 2 is a block diagram of one such mixer. The synthesizer output frequency 110 (fV) is connected to the first input of a mixer 212 and to the input of a 90° phase shifter 216. The offset frequency signal 120 ($f_{OFF}$) is coupled to the second input of mixer 212 and to the input of a second 90° phase shifter 218. The output signals of 90° phase shifters 216 and 218 are coupled to the first and second inputs of second mixer 222 respectively. The outputs of mixers 212 and 222 are added by the adder 220 to result in the mixer output 116 ($f_X$).

The mixer output 116 ($f_X$) is $$f_X = f_V - f_{OFF}$$

as illustrated using the following calculations:

$$f_V = \cos \omega_V t$$

$$f_{OFF} = \cos \omega_{OFF} t$$

$$\omega_V = 2\pi f_V$$

$$\omega_{OFF} = 2\pi f_{OFF}$$

Signals a(t) 214 and b(t) 224 are the outputs of mixers 212 and 222 respectively and are mathematically stated as:

$$a(t) = \cos \omega_V t \cos \omega_{OFF} t$$

$$b(t) = \cos (\omega_V t - 90°) \cos (\omega_{OFF} t - 90°)$$

Using the relationship $$\cos(a)\cos(b) = \tfrac{1}{2}\cos(a+b) + \tfrac{1}{2}\cos(a-b)$$

we have:

$$a(t) = \tfrac{1}{2}\cos(\omega_V + \omega_{OFF})t + \tfrac{1}{2}\cos(\omega_V - \omega_{OFF})t$$

and $$b(t) = -\tfrac{1}{2}\cos(\omega_V + \omega_{OFF})t + \tfrac{1}{2}\cos(\omega_V - \omega_{OFF})t$$

adding the two signals $$x(t) = a(t) + b(t) = \cos(\omega_V - \omega_{OFF})t$$

therefore $$f_X = f_V - f_{OFF}$$

It can be seen from the equations above that the amount of image cancellation is dependent upon the degree of amplitude balance and phase accuracy of the mixers 212 and 222 and 90° phase shifters 216 and 218. Image cancellation of 20 to 40 dB can be achieved in typical applications. By placing the offset mixer within the synthesizer loop, further reduction of the output spurious signal components which would result from the unwanted image response is achieved by the filtering action of the loop.

Since $f_V = f_X + f_{OFF}$, it is obvious that any center frequency error in $f_{OFF}$ will be translated to the output directly. For example, if $$f_V = 109.65 \; MHz$$

$$f_{OFF} = 150 \; KHz \pm 1\%$$

then $$f_X = 109.5 \; MHz$$

and $f_V$ will have an error range of $\pm 1.5$ KHz due to the tolerance of $f_{OFF}$ in addition to the tolerance of $f_X$ due to the synthesizer tolerance.

The use of an image balanced mixer 200 permits the utilization of a low frequency offset VCO 300. Additionally, with the image balanced mixer 200 in the synthesizer loop the need for filters to reject spurious signals from the mixer 200 is eliminated.

Figure 3:
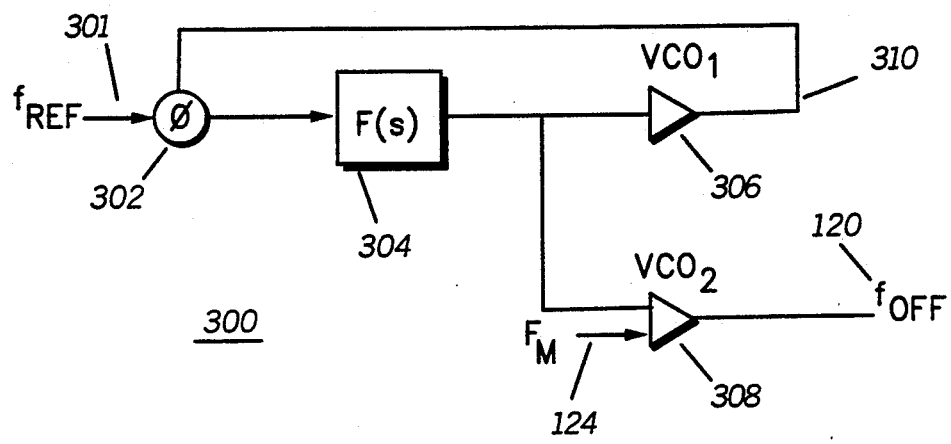
FIG. 3 is a block diagram of an offset signal controlled oscillator in accordance with the principles of the present invention.

FIG. 3 shows the internal elements of the offset frequency VCO 300. These elements along with the rest of the circuitry of the frequency synthesizer 100 are integrated on an IC. Such integration maintains a tight tolerance on the offset frequency VCO 300.

Referring now to FIG. 3, the $f_{REF}$ 301 is coupled to the first input of a phase comparator 302. The output of the phase comparator 302 is connected to the input of a loop filter 304 whose output is coupled to the inputs of two essentially identical VCOs 306 and 308. The output of the first VCO 306 is looped back to the second input of the phase comparator 302 via the signal line 310. The second VCO 308 has a second input which couples the modulating FM signal 124 to the offset VCO 300. The output of VCO 308 is $f_{OFF}$ 120 used in the frequency synthesizer 100.

The two VCOs 306 and 308 share a common control line, and since their IC layouts are matched, the output frequency of VCO2 308 will be very close to the locked VCO1 306. The VCO2 308 has a secondary control line which allows deviation +/− from the nominal center frequency to achieve the desired FM capability. The variations in the center frequency of the synthesizer output 110 due to the inherent tolerance of the offset VCO 300 are kept to a minimum by using a low frequency offset VCO 300.

Figure 4A:
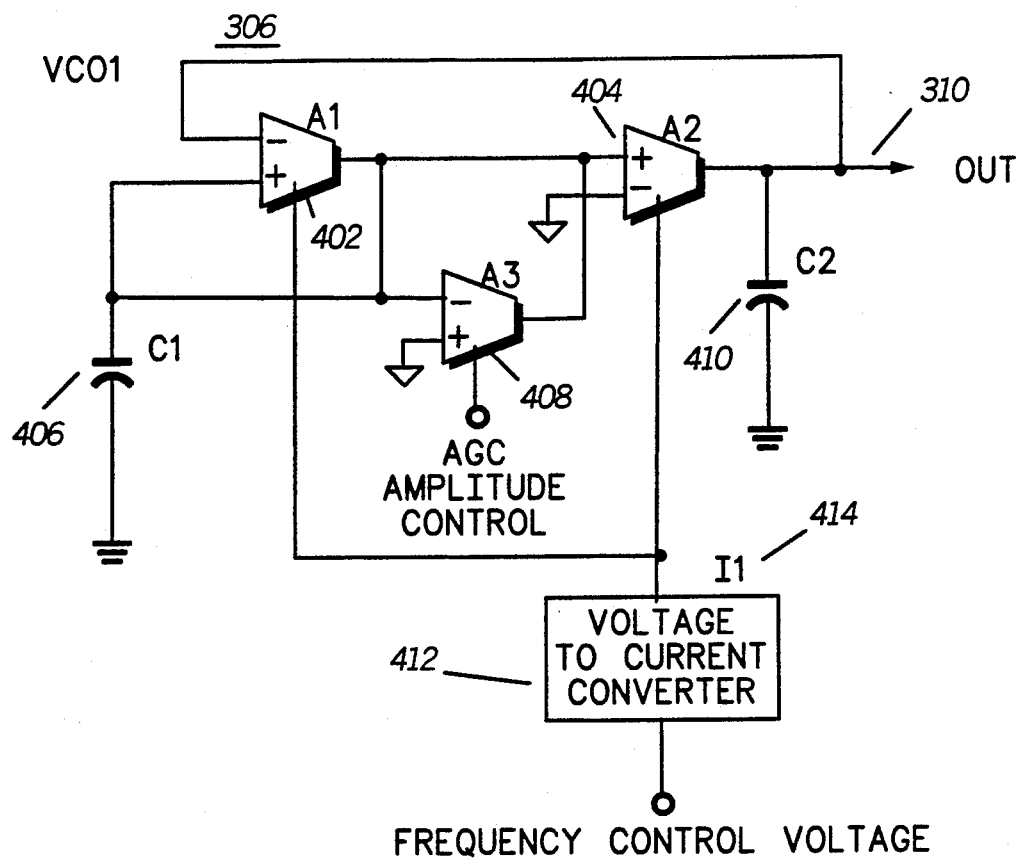
FIGS. 4A and 4B are schematic diagrams of a matched pair of signal controlled oscillators in accordance with the principles of the present invention.
Figure 4B:
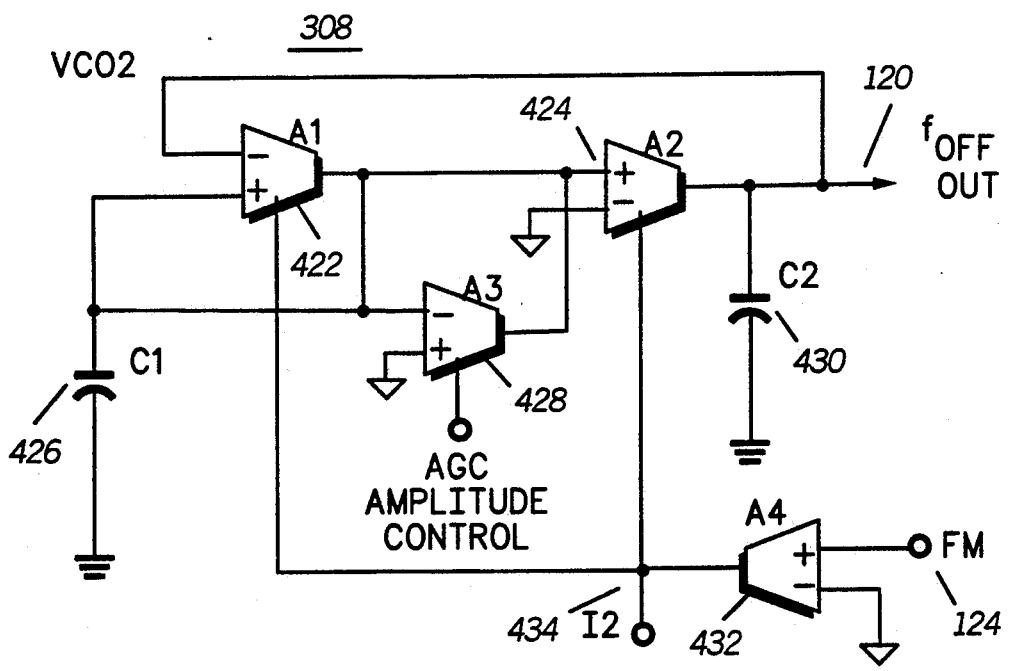

FIGS. 4A and 4B show block diagrams of a sample pair of the matched VCOs 306 and 308 integrated on the same IC for better matching. Referring to FIG. 4A, it can be seen that the three transconductance operational amplifiers 402, 404, and 408 are connected in such a fashion as to produce a closed loop. The voltage to current converter 412 converts the input frequency control voltage to current. The signal from this converter 412 is coupled to the control lines of the amplifiers 402 and 404 via the control line 414.

Referring now to FIG. 4B, it can be seen that the VCO 308 is identical to the VCO 306 except for the addition of a fourth transconductance operational amplifier 432. Once again the three transconductance operational amplifiers 422, 424, and 428 are configured so as to produce a closed loop. The current $I_1$ is duplicated to produce $I_2$ using a current mirror. $I_2$ is coupled to the control input of the amplifiers 422 and 424 via the control line 434. The FM input 124 is coupled to the input of the transconductance amplifier 432. The frequency is subsequently modulated +/− by adding/subtracting current from A4.

Figure 5:
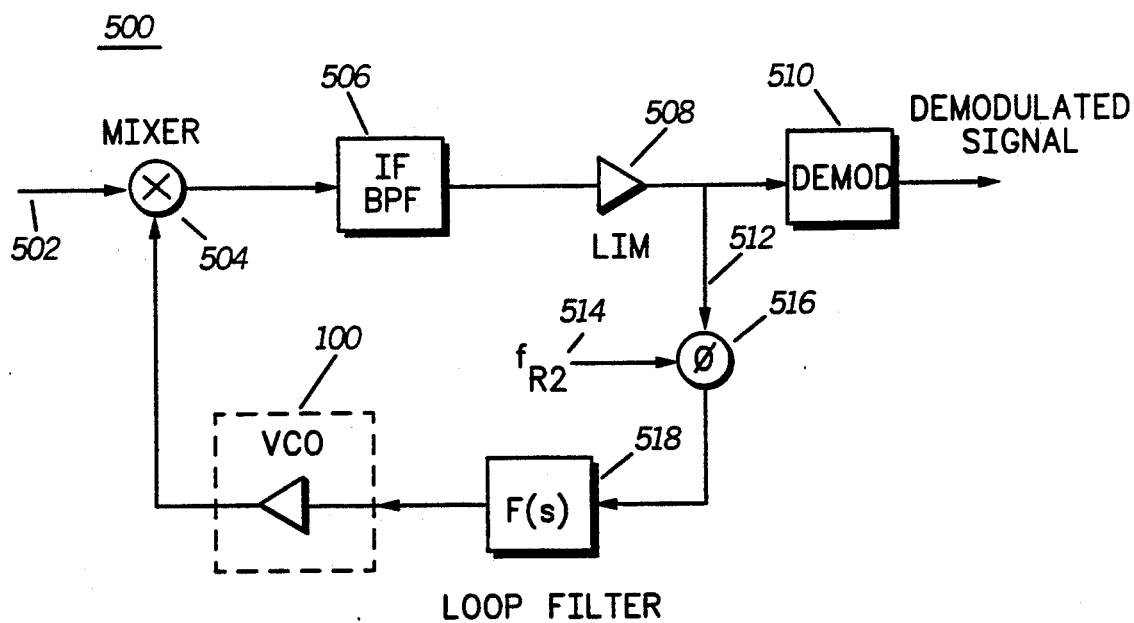
FIG. 5 is a block diagram of an FM receiver that includes a phase-locked loop local oscillator and that recovers modulation in accordance with the principles of the present invention.

FIG. 5 shows a phaselocking receiver 500 in accordance with the present invention. To better focus on the invention, this simplified receiver shows neither an RF amplifier stage nor a preselector for protection against image frequency signals, either of which may be included if necessary for the intended operating environment. The received frequency signal is coupled to the first input of a mixer 504. The output signal of the mixer 504 is filtered by a filter 506 and subsequently limited by a limiter 508. The output of the limiter 508 is coupled to the first input of a phase comparator 516 and to the input of a demodulator 510 via the signal line 512. The second input of the phase comparator 516 is connected to reference oscillator $f_{R2}$ 514. The frequency of the reference oscillator $f_{R2}$ 514 is set to the center of the IF frequency so that the received signal remains perfectly centered in the IF passband when the loop is locked. The output of the phase comparator 516 is coupled to a loop filter 518 and subsequently to the VCO 100. The loop is closed by the coupling of the output of the VCO 100 to the second input of the mixer 504.

A received radio frequency signal 502 is mixed, filtered, and limited by the mixer 504, the filter 506, and the limiter 508 respectively. The limited signal 512 of the limiter 508 is coupled to the demodulator 510. Those skilled in the art appreciate the use of several methods for demodulating the limited signal 512. The output signal of demodulator 510 is the recovered signal. Recovery of signals down in frequency to DC can be achieved by summing the output of the demodulator 510 with the FM control signal into VCO 100 as taught in the U.S. Pat. No. 4,837,853, the disclosure of which is hereby incorporated by reference.

The three reference signals $f_R$ 102, $f_{REF}$ 301, and $f_{R2}$ 514 may be derived from the same reference oscillator using circuitries well known to those skilled in the art.

Figure 6:
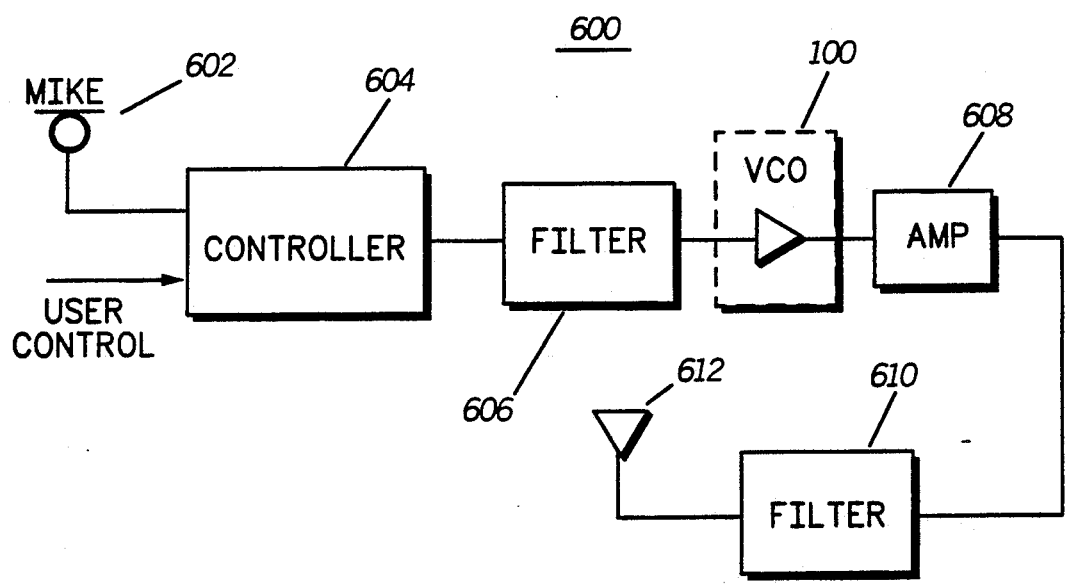
FIG. 6 is a block diagram of an FM transmitter that includes a frequency synthesizer in accordance with the present invention.

FIG. 6 shows a transmitter in accordance with the present invention. The signals from microphone 602 and user control signals are coupled to a controller 604. The output of the controller 604 is connected to a filter 606 whose output is coupled to the VCO 100. The frequency signal $f_V$ 110 of VCO 100 is coupled to the antenna 612 through a amplifier 608 and a filter 610.

Those skilled in the art appreciate the use of other receiver and transmitter circuits to achieve similar results. The presentation of receiver 500 and transmitter 600 is only meant as an illustration of the preferred embodiment of the present invention and not a limitation thereof.

To summarize, true DC frequency modulation capability is provided to a synthesizer 100 without requiring DC FM of the reference oscillator. The invention achieves DC FM by using a low frequency (e.g. 100 to 300 KHz) integrated offset VCO 300 whose center frequency is controlled accurately, by means of a feedback loop, and by using an image balanced mixer 200 to reduce the image response to substantially reduce or eliminate the filtering required at the mixer output. Also, by configuring the offset mixer 200 within the synthesizer 100 loop, any residual spurious content due to imperfect image balance or carrier feedthrough of the offset mixer 200 is attenuated by the loop response.

The invention further includes a phase comparator 104 for comparing the output signal of a reference oscillator $f_R$ 102 and the output of an image balanced mixer 200 divided by N. The phase differential of these two signals is filtered and converted to the output frequency by a main VCO 108. The output of the main VCO 108 is mixed with an offset signal produced by the offset VCO 300 at the image balanced mixer 200. The output signal of the main VCO 108 is the output of the synthesizer circuit.

I claim:

1. An improved frequency synthesizer producing true DC Frequency Modulation, comprising:
    a reference signal source for generating a reference signal;
    a phase comparator, having a first input coupled to said reference signal, a second input and an output, for producing at the output a control signal representative of the phase difference of signals received at the first and second inputs;
    a signal controlled oscillator producing an oscillator signal of frequency f at its output in response to the control signal of said phase comparator;
    an offset signal controlled oscillator producing an oscillator signal of frequency $f_{OFF}$ at its output in response to a modulating signal, the offset signal controlled oscillator including:
    a reference signal source for generating a low frequency reference signal;
    a phase comparator, having a first input coupled to said low frequency reference signal, a second input, and an output, for producing at the output a control signal representative of the phase difference of signals received at the first and second inputs;
    a matched pair of signal controlled oscillators having a common control line producing oscillator signals in response to the control signal of said phase comparator; and
    means for providing the output of the first of said matched signal controlled oscillators to the second input of said phase detector;
    mixing means for mixing frequency $f_{OFF}$ of said offset signal controlled oscillator and frequency f of said signal controlled oscillator and producing an output, and divider means for dividing the output of said mixing means by a divisor "N" and producing an output coupled to the second input of said phase comparator.

2. The improved frequency synthesizer of claim 1 wherein the second of said matched pair of signal controlled oscillators includes a second input for coupling to a modulating signal.

3. An improved frequency synthesizer producing true DC Frequency Modulation, comprising:

a reference signal source for generating a reference signal;

a phase comparator, having a first input coupled to said reference signal, a second input and an output, for producing at the output a control signal representative of the phase difference of signals received at the first and second inputs;

a signal controlled oscillator producing an oscillator signal of frequency f at its output in response to the control signal of said phase comparator;

an offset signal controlled oscillator producing a modulated oscillator signal of frequency $f_{OFF}$ at its output in response to a modulating signal;

an image balanced mixer for mixing frequency $f_{OFF}$ of said offset signal controlled oscillator and frequency f of said signal controlled oscillator and producing an output, and divider means for dividing the output of said mixing means by a divisor "N" and producing an output coupled to the second input of said phase comparator.

4. A receiver having a frequency synthesizer and adapted for recovering the modulating signal of a received carrier signal, the synthesizer comprising:

a reference signal source for generating a reference signal;

a phase comparator, having a first input coupled to said reference signal, a second input and an output, for producing at the output a control signal representative of the phase difference of signals received at the first and second inputs:

a signal controlled oscillator producing an oscillator signal of frequency f at its output in response to the control signal of said phase comparator;

an offset signal controlled oscillator producing an oscillator signal of frequency $f_{OFF}$ at its output, the offset signal controlled oscillator including:

a reference signal source for generating a low frequency reference signal;

a phase comparator, having a first input coupled to said low frequency reference signal, a second input, and an output, for producing at the output a control signal representative of the phase difference of signals received at the first and second inputs;

a matched pair of signal controlled oscillators having a common control line producing oscillator signals in response to the control signal of said phase comparator; and means for providing the output of the first of said matched signal controlled oscillators to the second input of said phase detector;

mixing means for mixing frequency $f_{OFF}$ of said offset signal controlled oscillator and frequency f of said signal controlled oscillator and producing an output; and divider means for dividing the output of said mixing means by a divisor "N" and producing an output coupled to the second input of said phase comparator.

5. The receiver of claim 4, wherein the second of said matched pair of signal controlled oscillators includes a second input for coupling to a modulating signal.

6. A transmitter for generating a carrier signal modulated via a modulation signal, comprising:

an improved frequency synthesizer producing true DC Frequency Modulation, comprising:

a reference signal source for generating a reference signal;

a phase comparator, having a first input coupled to said reference signal, a second input and an output, for producing at the output a control signal representative of the phase difference of signals received at the first and second inputs;

a signal controlled oscillator producing an oscillator signal of frequency f at its output in response to the control signal of said phase comparator;

an offset signal controlled oscillator producing an oscillator signal of frequency $f_{OFF}$ at its output in response to a modulating signal, the offset signal controlled oscillator including:

a reference signal source for generating a low frequency reference signal;

a phase comparator, having a first input coupled to said low frequency reference signal, a second input, and an output, for producing at the output a control signal representative of the phase difference of signals received at the first and second inputs;

a matched pair of signal controlled oscillators having a common control line producing oscillator signals in response to the control signal of said phase comparator; and means for providing the output of the first of said matched signal controlled oscillators to the second input of said phase detector:

mixing means for mixing frequency $f_{OFF}$ of said offset signal controlled oscillator and frequency f of said signal controlled oscillator and producing an output, and divider means for dividing the output of said mixing means by a divisor "N" and producing an output coupled to the second input of said phase comparator.

7. The transmitter of claim 6, wherein the second of said matched pair of signal controlled oscillators includes a second input for coupling to a modulating signal.

8. A transmitter for generating a carrier signal modulated via a modulation signal, comprising:

an improved frequency synthesizer producing true DC Frequency Modulation, comprising:

a reference signal source for generating a reference signal;

a phase comparator, having a first input coupled to said reference signal, a second input and an output, for producing at the output a control signal representative of the phase difference of signals received at the first and second inputs;

a signal controlled oscillator producing an oscillator signal of frequency f at its output in response to the control signal of said phase comparator;

an offset signal controlled oscillator producing a modulated oscillator signal of frequency $f_{OFF}$ at its output in response to a modulating signal;

an image balanced mixer for mixing frequency $f_{OFF}$ of said offset signal controlled oscillator and frequency f of said signal controlled oscillator and producing an output, and divider means for dividing the output of said mixing means by a divisor "N" and producing an output coupled to the second input of said phase comparator.

9. A frequency synthesizer having a reference signal and adapted for producing a true DC modulated signal at its output, comprising:

a main signal controlled oscillator;

an offset signal controlled oscillator producing a modulated signal for offsetting the reference signal, the oscillator having a modulating signal input for accepting modulating signals down to DC; and an image balanced offset mixer coupled to the offset signal controlled oscillator.

10. The frequency synthesizer of claim 9, wherein the offset signal controlled oscillator includes two signal controlled oscillators having matched layouts.

11. The frequency synthesizer of claim 9, wherein the offset signal controlled oscillator comprises a low frequency offset oscillator.

12. The frequency synthesizer of claim 11, wherein the low frequency offset oscillator comprises an offset oscillator operating below 300 KHz.

* * * * *